United States Patent

Hofmann et al.

[11] Patent Number: 5,876,574
[45] Date of Patent: Mar. 2, 1999

[54] MAGNET DESIGN FOR A SPUTTERING CHAMBER

[75] Inventors: Ralf Hofmann, San Jose; Zheng Xu, Foster City, both of Calif.

[73] Assignee: Applied Materials, Inc., Santa Clara, Calif.

[21] Appl. No.: 842,130

[22] Filed: Apr. 23, 1997

[51] Int. Cl.$^6$ .................................................. C23C 14/00

[52] U.S. Cl. ........................... 204/192.13; 204/192.12; 204/298.03; 204/298.19; 204/298.2

[58] Field of Search ........................... 204/192.12, 298.2, 204/298.19, 298.03, 192.13

[56] References Cited

U.S. PATENT DOCUMENTS

| | | | |
|---|---|---|---|
| 4,872,964 | 10/1989 | Suzuki et al. | 204/298.2 X |
| 4,995,958 | 2/1991 | Anderson et al. | 204/298.2 |
| 4,999,096 | 3/1991 | Nihei et al. | 204/298.06 X |
| 5,047,130 | 9/1991 | Akao et al. | 204/298.2 X |
| 5,178,739 | 1/1993 | Barnes et al. | 204/298.06 X |
| 5,242,566 | 9/1993 | Parker | 204/298.2 |
| 5,248,402 | 9/1993 | Ballentine et al. | 204/192.12 X |
| 5,252,194 | 10/1993 | Demaray et al. | 204/192.12 X |
| 5,314,597 | 5/1994 | Harra | 204/192.12 X |
| 5,320,728 | 6/1994 | Tepman | 204/298.2 X |

*Primary Examiner*—Nam Nguyen
*Assistant Examiner*—Steven H. Ver Steeg
*Attorney, Agent, or Firm*—Birgit E. Morris

[57] ABSTRACT

In order to improve the uniformity of erosion of a sputtering chamber target during sputtering, and to prevent re-deposition of target material onto the target surface, the size and shape of the magnet pair above the target is chosen to maximize uniform erosion across the surface of the target. Re-deposition of target material onto the target is particularly a problem during plasma, high pressure sputtering.

3 Claims, 5 Drawing Sheets

MAGNET DESIGN FOR A SPUTTERING CHAMBER

BACKGROUND OF THE INVENTION

Conventional PVD chambers include a target of the material to be sputtered, which target is connected to a source of power, a gas inlet for an inert gas such as argon and other gases, such as nitrogen, if required, and a substrate support mounted parallel and spaced from the target, which is biased. During sputtering, argon atoms become energized and strike the target, sputtering off atoms of the target material which then deposit on the substrate. In order to enhance the sputtering rate, a magnet pair is mounted above the target on the outside of the chamber. The magnet pair increases the momentum at which argon atoms strike the target.

FIG. 1 is a schematic cross sectional view of a typical sputtering chamber. A vacuum chamber 10 includes a target 12 of the material to be sputtered, and a substrate support 14. A source of DC power 13 is connected to the target 12. A pair of opposed magnets 16, 18 are mounted above the target 12. A power source 20, such as a source of RF power, is connected to the substrate support 14. During sputter deposition, a substrate 22 is mounted on the substrate support 14. A gas inlet 19 permits gases to be passed into the chamber. Argon is generally used as the sputtering gas. It is ionized in the chamber and is attracted to the target 12 by the negative potential of the target 12. The argon ions strike the surface of the target and sputter off particles of target material which deposit on the substrate 22.

As the features of semiconductor devices continue to become smaller, it is more difficult to fill the bottoms of small diameter, high aspect ratio openings by sputtering. Sputtering takes place in random directions and thus most of the sputtered material is deposited on land portions rather than in openings in the substrate. Further, since the sputtered particles enter openings in non-vertical directions, they impact the sidewalls and thus only a small proportion of the sputtered particles deposit on the bottom of the openings. This is shown in FIG. 2, wherein an opening 100 is partially filled with sputtered material 110.

In an attempt to improve the directionality of the sputtered particles, collimators have been tried, but they have been unable to greatly improve filling of small diameter, high aspect ratio openings.

Thus an improved sputtering chamber has been designed that includes an internal helical coil connected to a source of RF power. FIG. 3 is a schematic cross sectional view of this improved sputtering chamber, designated as an "ionized metal plasma" or "IMP" chamber. The IMP chamber 170 includes a conventional target 172 mounted on a top wall 173 of the chamber 170. A pair of opposing magnets 176, 178, are mounted over the top of the chamber 173. A substrate support 174 bearing a substrate 175 thereon, is mounted parallel to and spaced from the target 172. A source of power 180 is connected to the target 172 and a source of RF power 182 is connected to the substrate support 174. A controller 200 regulates gas flows. A helical coil 185 is mounted inside the chamber 170 between the target 172 and the substrate support 174, and is connected to a source of RF power 188. Gases in vessels 192, 194 are metered to the chamber by means of flow valves 196, 198.

The pressure in the chamber is maintained by a cryogenic pump 190 through an inlet 191 via a three position gate valve 199. Providing that the pressure in the chamber is fairly high, i.e., about 30–40 millitorr, the internal inductively coupled coil 186 provides a high density plasma in the region between the sputtering cathode or target 172 and the substrate support 174. Thus sputtered target atoms become ionized and positively charged as they pass through the high density plasma region. They are attracted by the negatively biased substrate and thus impact the substrate in a more vertical direction than occurs in conventional PVD chambers.

Conventional PVD chambers as shown in FIG. 1 are generally operated at low pressures of about 1–5 millitorr. Under the higher pressures in the IMP chamber, re-sputtering of target material onto the target occurs more frequently. Material that is sputtered from the target in an IMP chamber at higher pressures has a higher possibility to collide with argon molecules, changing the original direction of the sputtered particles. If such a collision occurs close to the target surface, it can be re-directed back towards the target where it re-deposits. Thus the problems of erosion and re-deposition are more severe in the IMP chamber than in conventional PVD chambers. These re-deposited particles are less adherent to the target, and they can flake off as particles, which is always undesirable.

Since it is known that the shape of the magnets for the target have an impact on the uniformity of erosion of the target during sputtering, improved magnet shapes were investigated.

SUMMARY OF THE INVENTION

Improved magnet designs have been developed that provide a more uniform target erosion pattern during sputtering, thereby avoiding or reducing re-deposition at the target surface. The erosion track of a target is monitored from the centerline of the target to the edge, and uniformity data used to provide a magnet shape that provides more uniform erosion of the target, particularly for the IMP sputtering chamber.

DETAILED DESCRIPTION OF THE INVENTION

In accordance with the invention, in order to avoid re-deposition of particles on the surface of a target during sputtering, the target ideally erodes uniformly across the target surface. In order to obtain uniform erosion, so that during sputtering the target surface remains as smooth and flat as possible, the shape of the magnet pair above the target must be chosen to provide erosion that is as uniform as possible.

If non-uniform erosion of the target surface occurs during sputtering, peaks and valleys in the target surface form. Re-sputtering of target material can occur readily on the high portions of the eroded target surface. Since the re-sputtered material does not adhere to the target as well as the original target material, this re-sputtered material loosens and breaks off, forming particles in the chamber which is always undesirable. If these particles deposit on the substrate, devices thereon can be destroyed.

Figure 1:
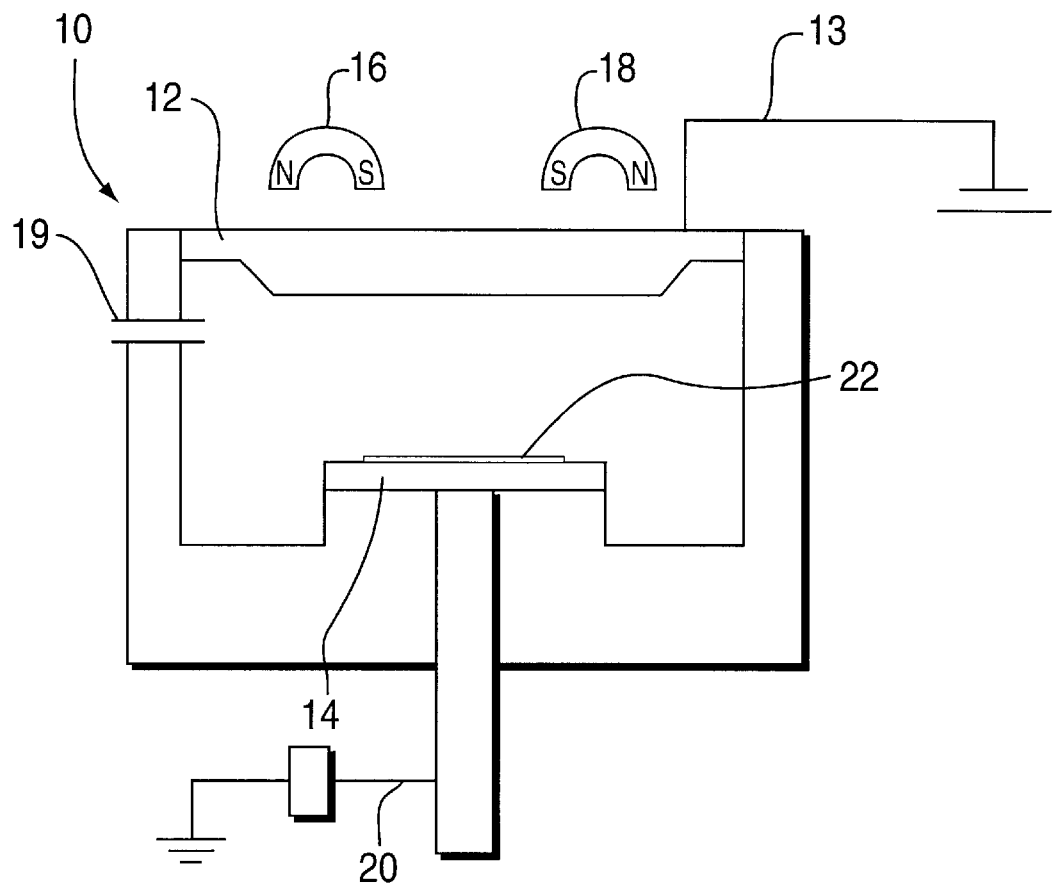
FIG. 1 is a schematic cross sectional view of a conventional sputtering chamber.
Figure 2:
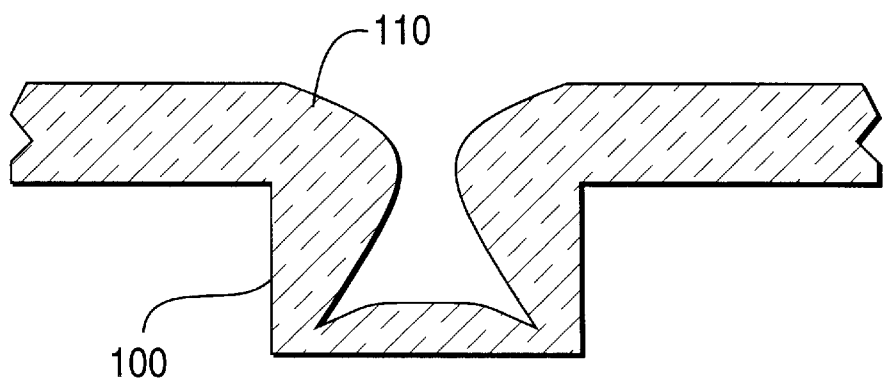
FIG. 2 is a schematic cross sectional view of a partially sputter filled opening in accordance with the prior art.
Figure 3:
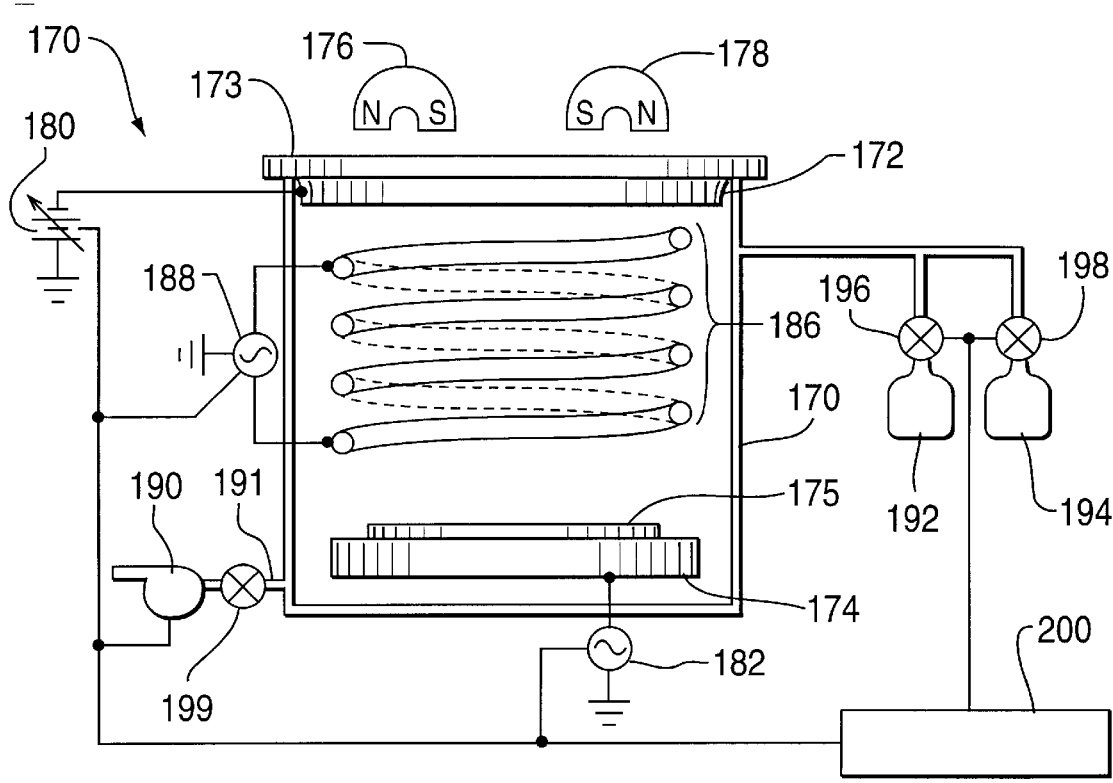
FIG. 3 is a schematic cross sectional view of a modified sputtering chamber that provides a high density plasma in the chamber.
Figure 4:
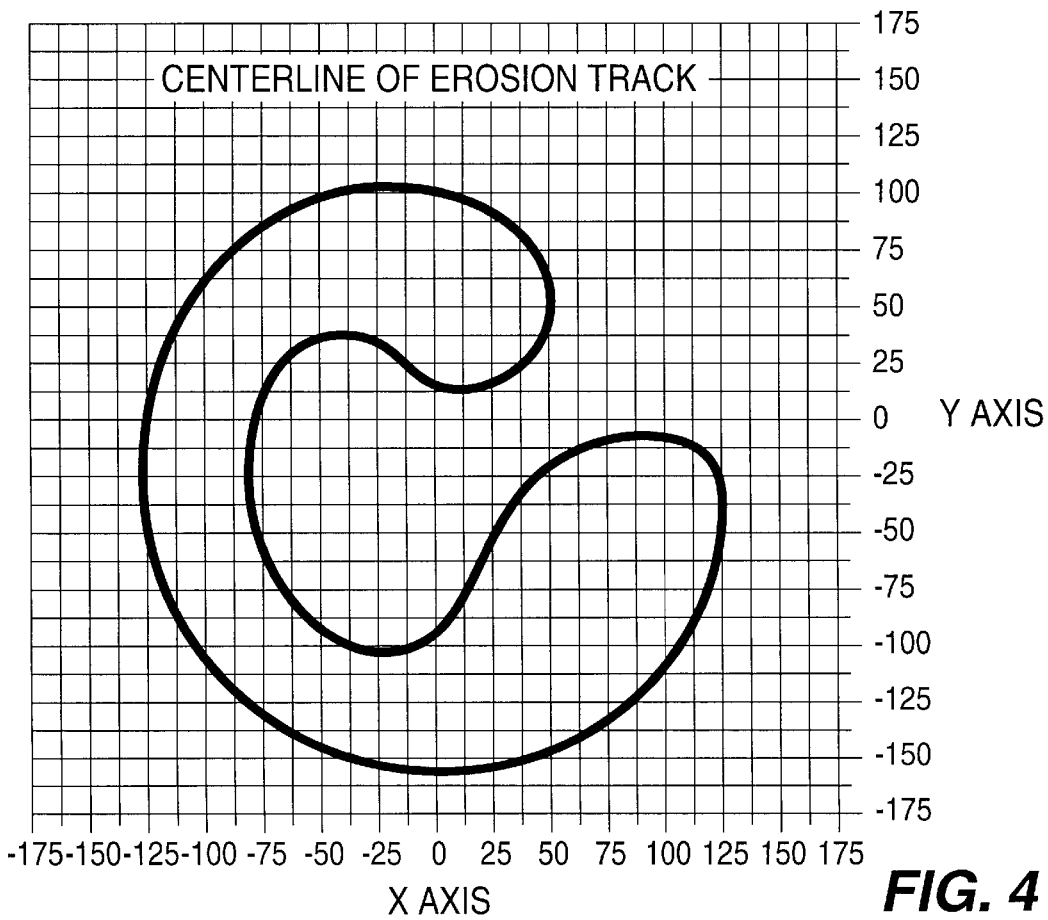
FIG. 4 depicts the centerline of the erosion track for a magnet of the invention.
Figure 5:
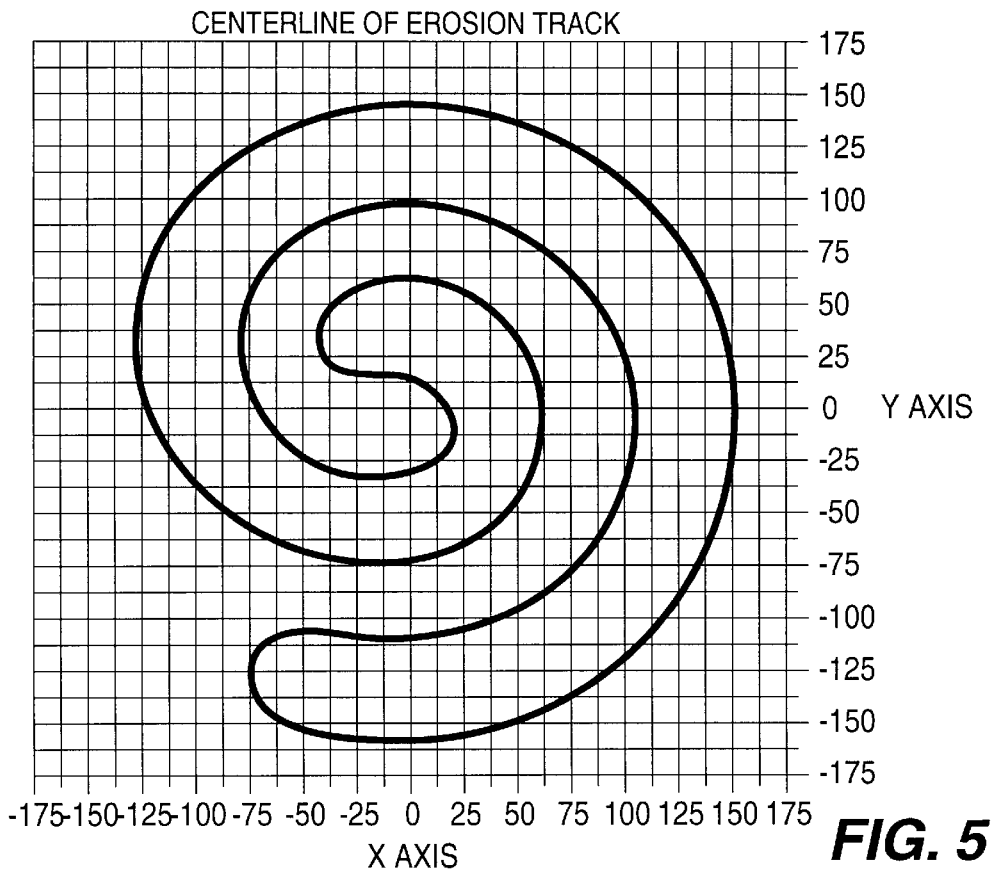
FIG. 5 depicts the centerline of the erosion track for a magnet of the prior art.

FIG. 4 shows the data points where the measured B-field of one magnet of the invention is parallel to the target surface and is stronger than 100 Gauss. This corresponds to the centerline of the erosion track of the magnet. This erosion track shows a curved, single turn, open ended magnet shape. The ends of the magnet are much wider, by about two times, than the middle portion of the magnet. FIG. 5 shows the same data points for a magnet of the prior art. The erosion track shows a curved, multi-turn magnet shape, the magnet having about the same width throughout its length.

Figure 6:
FIG. 6 is a comparison of the measured erosion track for a target magnet of the invention and a conventional prior art target magnet.

FIG. 6 shows the erosion profile of the relative erosion versus the target radius in inches using a conventional magnet (circles) and a magnet of the invention (squares) after 100 hours of burn-in in an IMP chamber wherein the target and the substrate were separated by 135 mm. The test was run at 40 millitorr pressure, using 5 kW of power to the target. Thus 500 kW hours of power was applied to the target after 100 hours. It is apparent that the relative target erosion using the prior art magnet (FIG. 5) is much more variable than when using the target magnet of the invention (FIG. 4), with higher peaks and deeper valleys. The magnet shape of FIG. 4 has erosion peaks and valleys that has a much more uniform erosion pattern, and target erosion occurs across the target. The erosion is more uniform but still is non-uniform. Some variation near the peaks and valleys is needed to permit re-sputtering of re-deposited material.

Referring still to FIG. 6, unsputtered regions for a target using a prior art magnet at 1–2 inches, at 3 inches and at 4.9 inches along the target radius become sites for re-deposition. Using the target magnet of the invention however, the erosion profile is much more uniform. Only near the edge of the target does the relative target erosion using the two magnets behave in similar fashion.

Figure 7:
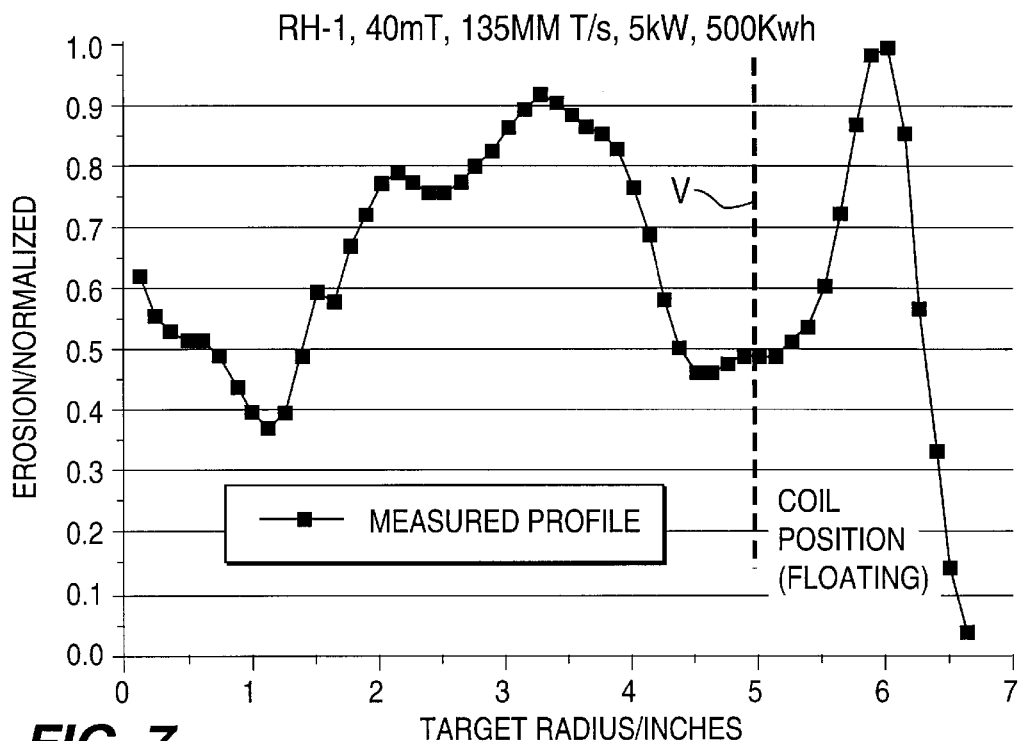
FIG. 7 is a graph of the erosion profile versus the target radius using a magnet of the invention.

FIG. 7 is a graph of the normalized measured target erosion versus the target radius. The dotted vertical line marked "V" shows the position of the helical coil in the chamber. The helical coil, which was floating, obviously caused some anomalies during sputtering, e.g., a distortion in the electric field at the target which caused reduced erosion of the target at the corresponding target radius.

Figure 8:
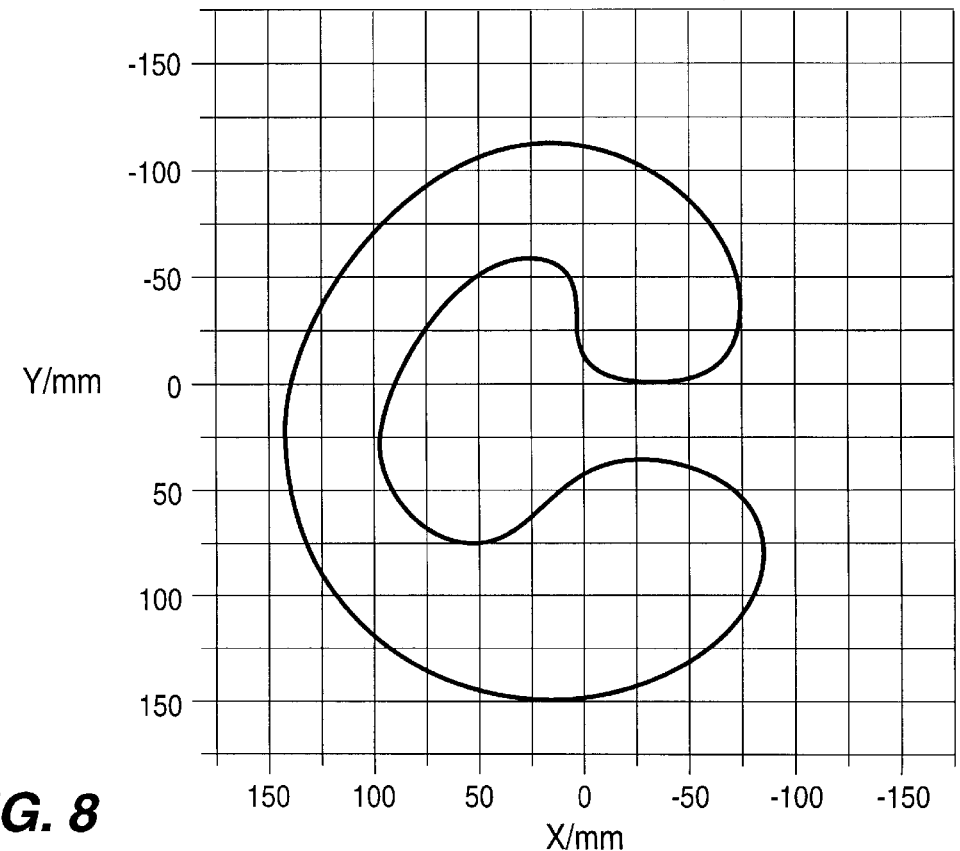
FIG. 8 is another graph of the erosion profile for another embodiment of a magnet of the invention.

FIG. 8 is a graph of the centerline for another magnet of the invention, which is slightly larger, particularly near the X axis. This magnet shape also has a curved, single turn open ended magnet shape, but the width near the ends are wider than that of FIG. 4.

Figure 9:
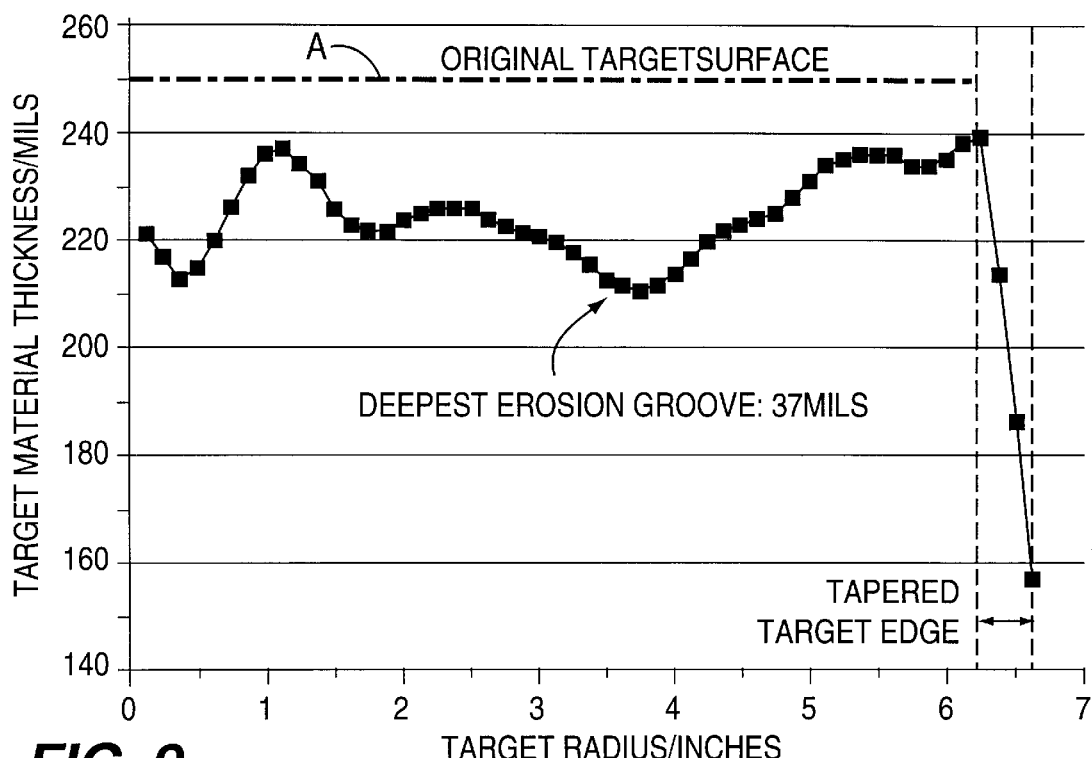
FIG. 9 illustrates the measured erosion profile for the magnet of FIG. 8.

FIG. 9 is an erosion profile of the relative erosion versus the target radius using the magnet of FIG. 8 after a burn-in at 38 millitorr pressure, using 3.5 Watts of DC power, and 3 kW of RF power after 430 hours of operation. The original target surface is shown at "A".

The target erosion was measured as a function of the target radius from the center. It is apparent that the erosion is quite uniform. The deepest erosion was about one-half way between the centerline and the edge of the target, and was only 37 mils deep.

Figure 10:
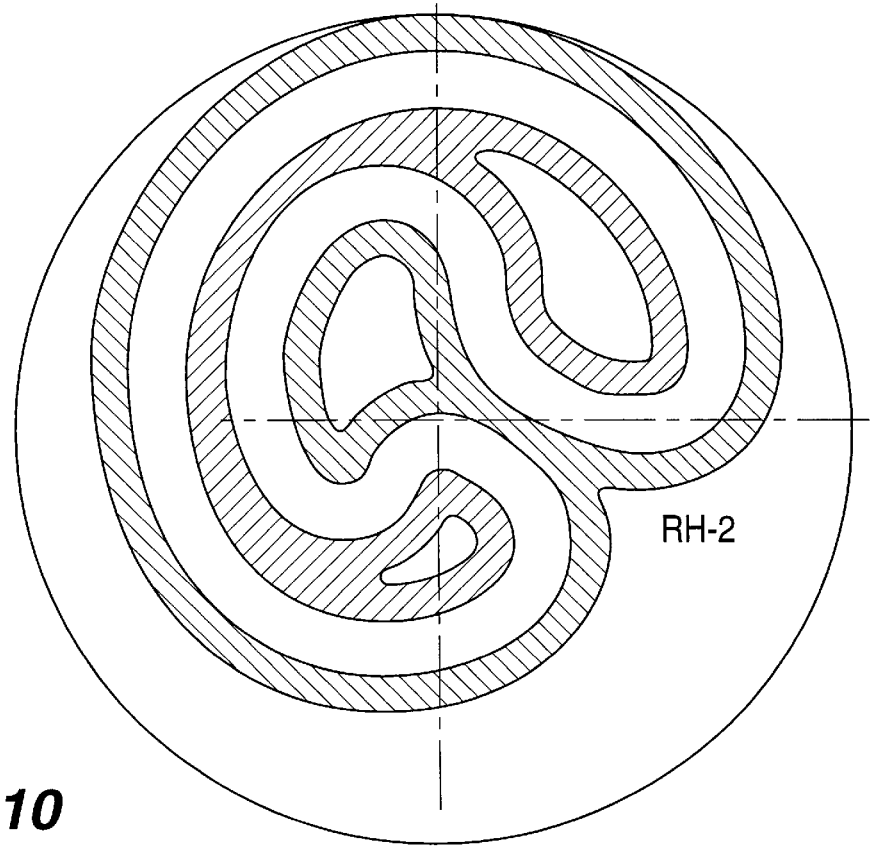
FIG. 10 is a top view of the inner and outer pole pieces for a magnet of the invention.

FIG. 10 is a top view of the pole pieces for the magnet pair of FIG. 8.

Although the invention has been described in terms of particular embodiments, other variations in the shape of the target pieces can be employed based on the target erosion data, and are meant to be included herein. Thus the invention is only to be limited by the scope of the appended claims.

We claim:

1. A method of reducing re-sputtering of a sputtering target over which is mounted an opposing pair of magnets comprising:

a) monitoring the target erosion track from the centerline of the target, and b) revising the shape of the magnets to provide a curved, single turn, open ended magnet shape about twice as thick near the open ends as in the center so that the erosion pattern of the target during sputtering is made more uniform.

2. An improved magnet pair for a sputtering target, each magnet having a shape so as to maximize erosion uniformity along the target from the centerline to the edge during sputtering, said magnets each being a curved, single turn, open ended shape about twice as thick near the open ends as in the center.

3. In an ionized metal plasma sputtering chamber comprising a target, a pair of magnets mounted over the target, a substrate support mounted parallel to and spaced from the target, a source of power connected to the target, a source of RF power connected to the substrate support, a helical coil mounted within the chamber between the target and the substrate support, and a source of RF power connected to the helical coil, the improvement comprising said pair of magnets having a curved, single turn, open ended shape wherein the open ends are about twice the thickness as the center, such that the erosion pattern of the target is of sufficient uniformity so that re-sputtering onto the target is reduced.

* * * * *